United States Patent [19]

Satriano

[11] Patent Number: 5,097,319
[45] Date of Patent: Mar. 17, 1992

[54] COVER WITH THROUGH TERMINALS FOR A HERMETICALLY SEALED ELECTRONIC PACKAGE

[75] Inventor: Robert J. Satriano, Hackettstown, N.J.

[73] Assignee: Harris Corporation, Melbourne, Fla.

[21] Appl. No.: 672,997

[22] Filed: Mar. 21, 1991

[51] Int. Cl.⁵ .............................................. H01L 23/02
[52] U.S. Cl. ..................................................... 357/74
[58] Field of Search ........................ 174/52.4; 439/390; 357/74

[56] References Cited

U.S. PATENT DOCUMENTS

| | | | |
|---|---|---|---|
| 2,439,589 | 4/1948 | Sundell | 439/390 |
| 3,771,107 | 11/1973 | Forster et al. | 439/390 |
| 3,775,645 | 11/1973 | McCarthy | 317/234 A |
| 3,831,066 | 8/1974 | Gabrail | 317/234 R |
| 4,731,130 | 3/1988 | O'Leary | 148/24 |
| 4,771,159 | 9/1988 | O'Leary | 219/85 M |
| 4,775,917 | 10/1988 | Eichorn et al. | 357/68 |
| 4,818,821 | 4/1989 | Wentworth et al. | 174/52.4 |
| 4,903,120 | 2/1990 | Beene et al. | 357/74 |

Primary Examiner—James W. Davie
Attorney, Agent, or Firm—Watov & Kipnes

[57] ABSTRACT

A cover for a semiconductor package consists of a plate of ceramic material, and has on its upper surface one or more openings for individually receiving terminals. Hollow truncated cylindrical-like cups each have a closed top portion with an opening for receiving an end of a threaded mounting stud, and an open bottom portion for mounting the cup over a terminal hole in the plate. The cups are each filled with a plurality of solder-coated pellets prior to mounting on the plate. The plate is then secured to the open top of the semiconductor package in a manner such that terminals protruding from the interior of the package pass through the holes in the plate and into the interior of the overlying cups, whereby the pellets provide electrical contact between the terminal and the end of the mounting stud protruding into the interior of the associated cup. The cups are heated to melt the solder on the pellets, for fusing the same to one another, to the terminal, and to the end of the threaded stud, for insuring a rigid mechanical and electrical connection therebetween.

16 Claims, 2 Drawing Sheets

COVER WITH THROUGH TERMINALS FOR A HERMETICALLY SEALED ELECTRONIC PACKAGE

FIELD OF INVENTION

This invention is in the field of hermetically sealed packages for electronic components.

BACKGROUND OF THE INVENTION

Hermetically sealed packages for electronic components from which connections to those components extend have been comprised of a base having a wall thereon and a cover on the wall. These components are generally made from ceramic material, and the electronic components are mounted in the space between the base and the cover. Terminals from the electronic device extend through apertures in the cover, and hermetic seals are formed between the cover and the wall and between the terminals and the edges of the aperture.

In some applications, the terminals are fairly rigid so that the physical connections of suitably stiff leads thereto can rupture their hermetic seals. Another disadvantage is that the hermetic seals can also be ruptured by thermal expansion of the terminals. Furthermore, the hermetic seals can only be tested after the entire package is completely fabricated so that any leak that may be present can be in any of the many seals.

SUMMARY OF AN EMBODIMENT OF THE INVENTION

An object of this invention is to provide an improved cover for hermetically sealed packages for electronic components having terminals protruding through the cover.

In accordance with one aspect of this invention, a cup is mounted over the end of each terminal extending through the cover, and the lip of the cup is hermetically sealed to the cover. A threaded stud extends through the bottom of each cup and is hermetically sealed thereto. Whether the terminal and stud are in contact with each other is unimportant because electrical connection between them is achieved by pellets contained within the cups having conductive surfaces. Preferably, the pellets are copper spheres that are coated with solder that is made to flow by the application of heat. With this construction the hermetic seal of each cup to the cover can be tested before the cup is adjoined to the wall, and heavy leads may be attached to the terminals without disturbing the hermetic integrity of the package.

In accordance with another aspect of this invention metal strips, preferably copper, are respectively brazed to the top of the wall and to the adjacent side of the cover, and the strips protrude outwardly from the wall and cover so that they can be hermetically joined together by laser or tungsten inert gas welding (TIG). This allows the cover of the package to move with the expansion of the terminals during temperature changes without affecting the hermeticity of the seal between the cover and the wall.

BRIEF DESCRIPTION OF THE DRAWINGS

In the various figures of the drawing corresponding components are designated in the same way.

DETAILED DESCRIPTION OF THE DRAWINGS

Figure 1:
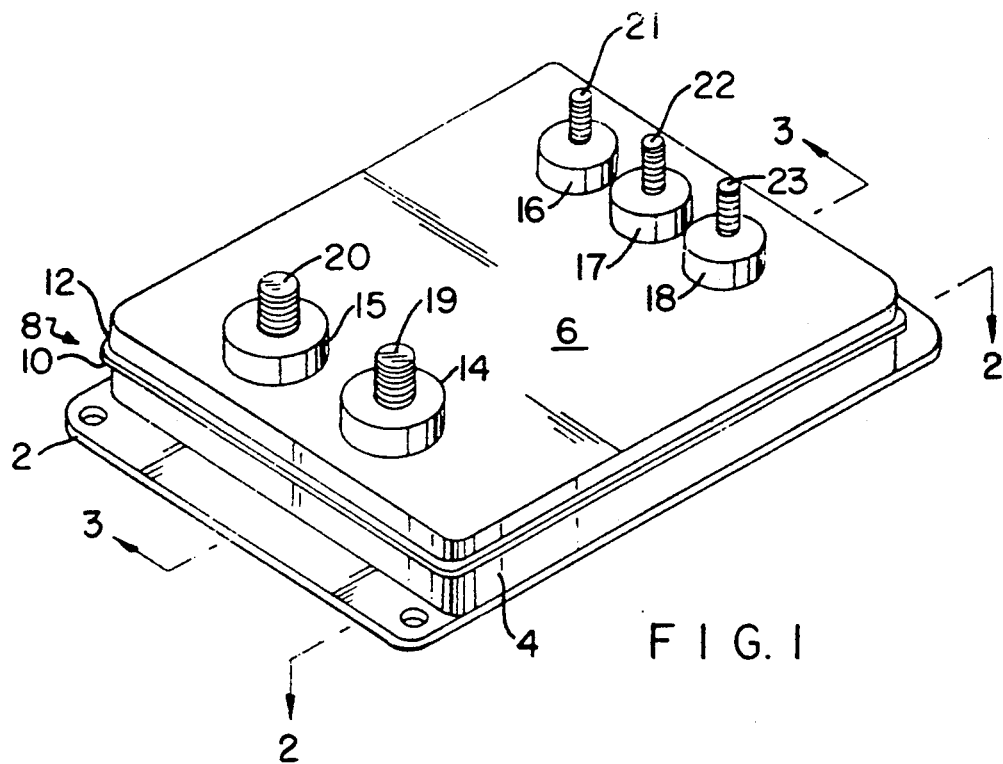
FIG. 1 is a perspective view of the outside of a hermetically sealed package constructed in accordance with this invention.

In FIG. 1 a package for hermetically sealing electronic components in accordance with this invention is shown to be comprised of a base 2 having a wall 4 mounted thereon and a cover 6 affixed to the top of the wall 4. Hermetic sealing between the wall 4 and cover 6 is indicated at 8. A metal strip 10 is adhered to the top of the wall 4 and a metal strip 12 is adhered to the periphery of the under surface of the cover 6. Both strips 10 and 12 extend outwardly from the wall 4 and the cover 6 and are preferably sealed together by laser or tungsten inert gas welding.

Cups 14, 15, 16, 17 and 18 have their lips hermetically sealed to the top of the cover 6, e.g., by brazing to metallization thereon, and metal threaded studs 19, 20, 21, 22 and 23, extend from the cups 14 through 18, respectively. If the studs 19-23 and cups 14-18 are separate pieces, hermetic seals are formed between them by brazing. The cups are preferably made of metal but may be made of ceramic material that is metallized where brazing occurs. Typically the cups 14-18 are made of Kovar, and the studs 19-23 are copper.

Figure 2:
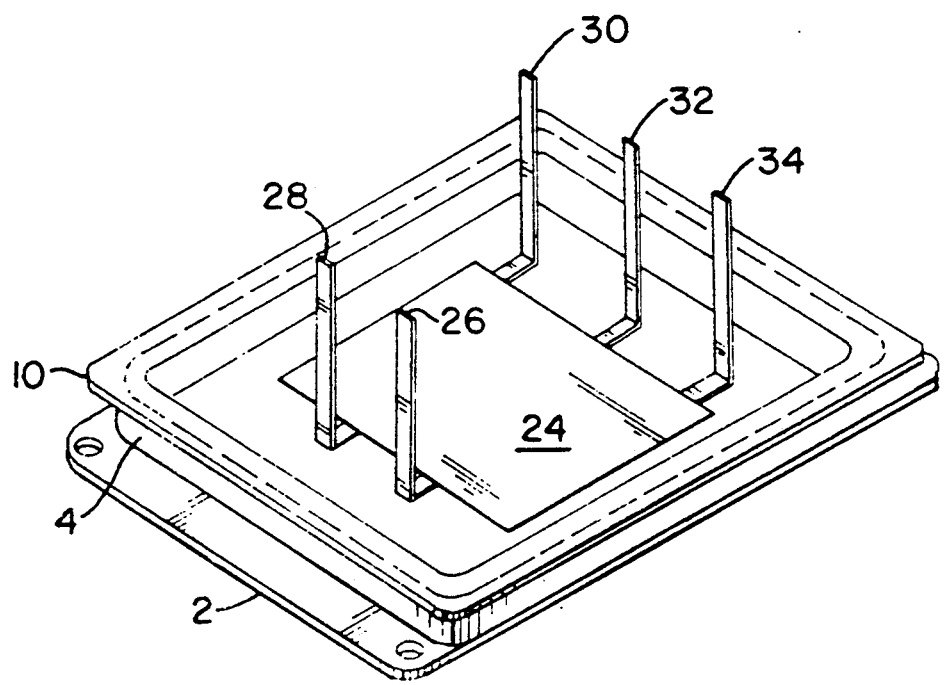
FIG. 2 is a section of AA of FIG. 1 showing the package with the cover removed.

FIG. 2 is a view of the package of FIG. 1 with the cover 6 removed. Electronic components 24 are mounted on the base 2 within the wall 4 and have terminals 26, 28, 30, 32 and 34 extending perpendicularly from the base 2.

Figure 3:
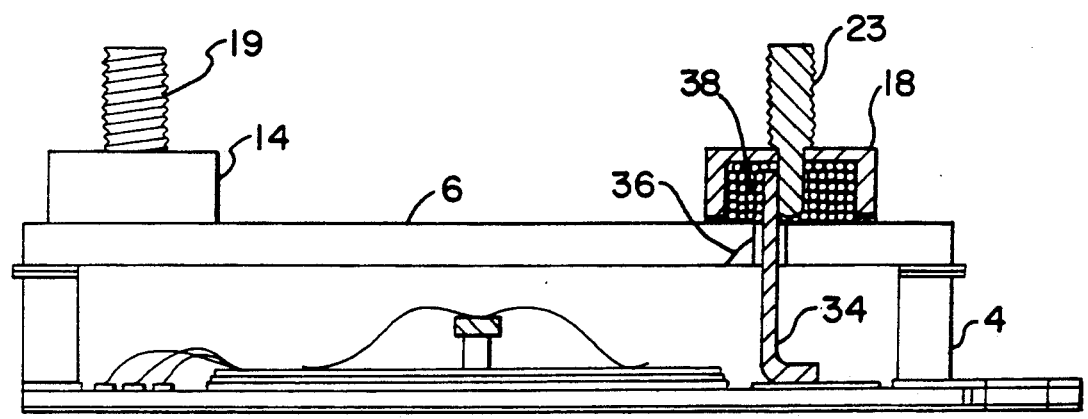
FIG. 3 is a section BB of FIG. 1 showing the internal construction of the package.

As illustrated in FIG. 3, the terminal 34 extends through an opening 36 in the cover 6 and into the cup 18. Preferably, the terminal 34 is in contact with an end of the stud 23, but this is not necessary because electrical connections between the terminal 34 and the stud 23 are established by pellets 38 within the cup 18. The pellets 38 have conducting surfaces, preferably solder, and are preferably spherical so as to make it easier for the terminal 34 to be inserted into the cup 18. Better electrical connections are achieved if solder coated pellets are subjected to heat so as to make the solder flow after the package is assembled.

The other terminals 26, 28, 30 and 32 are respectively connected to the studs 19 through 22, respectively, in the same way as just described in connection with the terminal 34 and the stud 23. An advantage of this construction is that the terminals 26, 28, 30, 32 and 34 need only be located and aligned with sufficient accuracy that they pass through the respective openings such as 36 in the cover 6 because conductive connections to the respective studs are made by the spheres or pellets 38. In addition, connections established by solder coated spheres 38 are more reliable than mechanical techniques currently used in feed through type terminal packages.

Another advantage of the novel construction is that the seals between the lips of the cups 14 through 18 and the top surface of the cover 6, as well as the seals between the studs 19-22 and the cups 14-18, can be tested prior to the assembly of the package.

Furthermore, the laser or TIG welded copper seal between the strips 10 and 12 allows the cover 6 to move with the expansion of the terminals 26, 28, 30 and 32 during temperature changes without affecting the hermeticity.

The package may be assembled by inserting the studs 19 through 23 into the cups 14 through 18, respectively forming hermetic seals therebetween by brazing, and then brazing the cups 14–18 to the cover plate 6. The hermeticity of these seals is then tested. Next the cups are filled with the pellets 38 while they are held with the lips of the cups facing upwards, for example. Then the base 2 is manipulated so that the terminals 26, 28, 30, 32, and 34 extend through associated openings in the cover 6, and into the cups 14–18, respectively. The entire package is heated so as to reflow the solder on the pellets 38, and then the copper strips 10 and 12 are welded by a laser or TIG process.

Connections of leads to the studs 19–23 can be made with threaded nuts without disturbing the hermetic seals.

Although various embodiments of the invention have been described herein for purposes of illustration, they are not meant to be limiting. Modifications and changes to these illustrated embodiments may occur to those of skill in the art, which are meant to be covered by the spirit and scope of the appended claims.

I claim:
1. A cover for a semiconductor package comprising:
a plate of non-conductive material;
means defining an opening in said plate;
a cup, said cup having a bottom and a lip;
a stud of electrically conductive material extending through the bottom of said cup into an interior space thereof;
means hermetically sealing the lip of said cup to one side of said plate and around said opening; and
pellets having conductive surfaces located within said cup, whereby a terminal extending through said opening in said plate and into said cup is placed into electrical contact with said stud via said pellets.

2. A cover as set forth in claim 1, wherein said cup is made of conductive material.

3. A cover as set forth in claim 1, wherein the conductive surfaces of said pellets are coated with solder.

4. A cover as set forth in claim 3, wherein said pellets are spheres.

5. A cover as set forth in claim 1, further including:
a strip of conductive material secured to a side of said plate extending around its perimeter.

6. A cover as set forth in claim 5, wherein said strip of conductive material extends outwardly from the perimeter of said plate.

7. A cover as set forth in claim 6, wherein said strip is made of copper.

8. A cover as set forth in claim 7, wherein said strip is brazed to said cover.

9. A cover as set forth in claim 8, wherein said means hermetically sealing the lip of said cup to said one side of said plate, includes metallization deposited on said one side around said opening that is brazed to the lip of said cup.

10. A hermetically sealed package for electrical components comprising:
walls defining a chamber;
electrical components mounted within said chamber;
means defining an opening in a wall of said chamber;
a terminal for one of said electrical components extending through said opening;
a cup having a lip that is hermetically sealed around said opening;
a conductive member extending from the inside of said cup to a point outside it; and
pellets having conductive surfaces contained within said cup so as to provide electrical contact between said terminal and said conductive member.

11. A hermetically sealed package as set forth in claim 10, wherein said pellets are solder coated copper spheres.

12. A hermetically sealed package as set forth in claim 11, wherein said solder has been made to flow by application of heat.

13. A cover system for a semiconductor package comprising:
a plate of non-conductive material having a plurality of openings through an upper surface for individually receiving electrically conductive terminals, respectively;
a plurality of truncated cylindrical-like hollow cups each having a substantially closed top portion with a relatively small opening therethrough, respectively;
a plurality of electrically conductive mounting studs each having one end rigidly mounted upon the top of an individual one of said cups, respectively, and protruding into its associated said cup through the small opening thereon; and
a plurality of electrically conductive pellets filling the interior of each one of said plurality of cups, respectively, whereby said pellets electrically interconnect said mounting studs to said electrically conductive terminals 14. The cover system of claim 13, further including a solder coating upon each one of said pellets, whereby after assembly of said cover to said package, said cups are heated to cause said solder to melt, for soldering said pellets to one another, to said associated electrical terminal, and to the end of the associated mounting stud, thereby insuring a rigid mechanical and electrical connection therebetween 15. The cover system of claim 13, wherein said plate consists of ceramic material.

16. The cover system of claim 13, wherein the other ends of said plurality of mounting studs, respectively, are threaded.

* * * * *

UNITED STATES PATENT AND TRADEMARK OFFICE
CERTIFICATE OF CORRECTION

PATENT NO. : 5,097,319
DATED : March 17, 1992
INVENTOR(S) : Robert J. Satriano

It is certified that error appears in the above-identified patent and that said Letters Patent is hereby corrected as shown below:

Column 2, line 4, change "of AA" to --taken along 2-2--.

Column 2, line 6, change "BB" to --taken along 3-3--.

Signed and Sealed this

Twenty-second Day of June, 1993

Attest:

MICHAEL K. KIRK

*Attesting Officer*  *Acting Commissioner of Patents and Trademarks*